US008766368B2

(12) United States Patent
Kang et al.

(10) Patent No.: US 8,766,368 B2
(45) Date of Patent: Jul. 1, 2014

(54) SEMICONDUCTOR DEVICES HAVING DOUBLE-LAYERED METAL CONTACTS AND METHODS OF FABRICATING THE SAME

(75) Inventors: Chun Soo Kang, Yongin-si (KR); Sang Jin Oh, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 7 days.

(21) Appl. No.: 13/615,092

(22) Filed: Sep. 13, 2012

(65) Prior Publication Data
US 2013/0193518 A1  Aug. 1, 2013

(30) Foreign Application Priority Data

Feb. 1, 2012 (KR) .................. 10-2012-0010530

(51) Int. Cl.
*H01L 27/088* (2006.01)
*H01L 21/768* (2006.01)
*H01L 29/24* (2006.01)

(52) U.S. Cl.
USPC .............. 257/368; 257/E27.06; 257/E21.584; 438/643

(58) Field of Classification Search
USPC ................. 257/E23.144–E23.151, 257/E23.168–E23.175, 300, 390, 257/E27.075–E27.085, 368, E27.06, 257/E21.584; 438/6, 128–129, 618–620, 438/643
See application file for complete search history.

(56) References Cited

U.S. PATENT DOCUMENTS

| | | | |
|---|---|---|---|
| 6,218,197 B1* | 4/2001 | Kasai ............................... 438/3 |
| 6,458,602 B1* | 10/2002 | Yunogami et al. ............... 438/3 |
| 2002/0036317 A1* | 3/2002 | Matsui et al. ................. 257/315 |
| 2002/0074661 A1* | 6/2002 | Tsunemine et al. .......... 257/758 |
| 2004/0195601 A1* | 10/2004 | Kumura et al. ............... 257/295 |
| 2006/0170023 A1* | 8/2006 | Nikaido et al. ............... 257/296 |
| 2011/0248344 A1 | 10/2011 | Nitta et al. |
| 2012/0168952 A1 | 7/2012 | Farooq et al. |

* cited by examiner

*Primary Examiner* — Fernando L Toledo
*Assistant Examiner* — Lawrence-Linh T Nguyen
(74) *Attorney, Agent, or Firm* — William Park & Associates Patent Ltd.

(57) ABSTRACT

Semiconductor devices are provided. The semiconductor device includes a semiconductor substrate having a cell region and a peripheral region, first and second conductive line extending onto the semiconductor substrate to constitute a peripheral circuit, a first interlayer insulation layer on the first and second conductive lines, a first peripheral interconnection pattern on the first interlayer insulation layer of the peripheral region, a first contact plug disposed in the first interlayer insulation layer, second peripheral interconnection patterns on the second interlayer insulation layer of the peripheral region, a second contact plug disposed in the second interlayer insulation layer to electrically connect the first peripheral interconnection pattern to one of the second peripheral interconnection patterns, and a third contact plug penetrating the first and second interlayer insulation layers to electrically connect the second conductive line to another one of the second peripheral interconnection patterns.

19 Claims, 7 Drawing Sheets

SEMICONDUCTOR DEVICES HAVING DOUBLE-LAYERED METAL CONTACTS AND METHODS OF FABRICATING THE SAME

CROSS-REFERENCE TO RELATED APPLICATION

The present application claims priority under 35 U.S.C 119(a) to Korean Application No. 10-2012-0010530, filed on Feb. 1, 2012, in the Korean Intellectual Property Office, which is incorporated herein by reference in its entirety as set forth in full.

BACKGROUND

Various embodiments of the present disclosure generally relate to semiconductor devices and methods of fabricating the same and, more particularly, to semiconductor devices having double-layered metal contacts and methods of fabricating the same.

Semiconductor memory devices may include dynamic random access memory (DRAM) devices as typical volatile memory devices, and the DRAM devices may include cell capacitors to store data. In order to fabricate high density DRAM devices, memory cells including the cell capacitors must be scaled down in size to the sub-micrometer range. This causes reduction of cell capacitor area, resulting in reduction of cell capacitance. In this case, the reduction of the cell capacitance may lead to a decrease in refresh cycle time of the DRAM devices and may result in an increase of soft error rates (SER) which are due to alpha particles. That is, the reduction of the cell capacitance may lead to the decrease of a sensing margin of the DRAM devices and malfunction of the DRAM devices. Meanwhile, a parasitic capacitance, for example, a bit line capacitance should be reduced to obtain a fast operation speed of the DRAM devices. Accordingly, in order to realize high performance DRAM devices with high integration density, the cell capacitance should be increased whereas the parasitic capacitance should be reduced.

As the DRAM devices become more highly integrated, a design rule (e.g., a minimum feature size) has been abruptly reduced. Thus, a height of the cell capacitors should be increased to obtain a sufficient cell capacitance for realizing high performance DRAM devices. However, in the event that the height of the cell capacitors increases, a step height between a cell array region and a peripheral circuit region may also increase. In such a case, burden on an etch process for forming a plate node on the cell array region may be increased. That is, a process margin of the etch process for forming the plate node may be reduced. Further, as the design rule of the DRAM devices becomes reduced, a pitch size of line patterns formed in the peripheral circuit region may also be reduced. Thus, it may be difficult to accurately form the line patterns in the peripheral circuit region using a single patterning technology. Accordingly, a double patterning technology has been proposed to form the fine line patterns in the peripheral circuit region.

Moreover, as the height of the cell capacitors become more increased, heights of metal contact plugs for connecting transistors or the cell capacitors to metal lines may also be increased. The metal contact plugs may be formed in metal contact holes. Thus, depths of the metal contact holes may also be increased. If the depths of the metal contact holes increase, a probability of electrical shortages between the adjacent metal contact plugs may be increased. This is because the metal contact holes are formed to have sloped sidewalls. For example, the metal contact holes may be formed to have positive sloped sidewalls because of the nature of the etch process for forming the metal contact holes. In particular, when a cleaning process is applied to a substrate including the metal contact holes, the metal contact holes may be enlarged to more increase the probability of the electrical shortages between the adjacent metal contact plugs. Accordingly, distances between metal contact holes should be increased to prevent the electrical shortages between the adjacent metal contact plugs. However, in such a case, the integration density of the DRAM devices may be degraded.

SUMMARY

Various embodiments are generally directed to semiconductor devices having double-layered metal contacts and methods of fabricating the same.

According to various embodiments, a semiconductor device includes a semiconductor substrate having a cell region and a peripheral region, a first conductive line and a second conductive line extending onto the semiconductor substrate of the peripheral region to constitute a peripheral circuit, a first interlayer insulation layer on the first and second conductive lines and on the semiconductor substrate, a first peripheral interconnection pattern on the first interlayer insulation layer of the peripheral region, a first contact plug disposed in the first interlayer insulation layer of the peripheral region to electrically connect the first conductive line to the first peripheral interconnection pattern, a second interlayer insulation layer on the first interlayer insulation layer and on the first peripheral interconnection pattern, second peripheral interconnection patterns on the second interlayer insulation layer of the peripheral region, a second contact plug disposed in the second interlayer insulation layer to electrically connect the first peripheral interconnection pattern to one of the second peripheral interconnection patterns, and a third contact plug penetrating the first and second interlayer insulation layers to electrically connect the second conductive line to another one of the second peripheral interconnection patterns.

In various embodiments, the peripheral circuit may be a sub-word line driver.

In various embodiments, the first conductive line includes a gate of a cell transistor, and the second conductive line includes a gate of an isolation transistor.

In various embodiments, the peripheral circuit may be a sense amplifier, and the first and second conductive lines may be electrically connected to bit lines formed in the cell region.

In various embodiments, the semiconductor device may further include protection layers between the first and second conductive lines and the first interlayer insulation layer, bit lines between the protection layers and the first interlayer insulation layer, an insulation layer filling spaces between the bit lines and exposing upper sidewalls of the bit lines, and a capping layer between the bit lines and the first interlayer insulation layer.

According to various embodiments, a semiconductor device includes a semiconductor substrate having a cell region and a peripheral region, a gate of a cell transistor and a gate of an isolation transistor extending onto the semiconductor substrate from the cell region to the peripheral region to constitute a peripheral circuit, a first interlayer insulation layer on the gate of the cell transistor, the gate of the isolation transistor and the semiconductor substrate, a first peripheral interconnection pattern on the first interlayer insulation layer of the peripheral region, a first contact plug disposed in the first interlayer insulation layer of the peripheral region to electrically connect the gate of the cell transistor to the first peripheral interconnection pattern, a second interlayer insulation layer on the first interlayer insulation layer and on the first peripheral interconnection pattern, second peripheral interconnection patterns on the second interlayer insulation layer of the peripheral region, a second contact plug disposed in the second interlayer insulation layer to electrically connect the first peripheral interconnection pattern to one of the second peripheral interconnection patterns, and a third contact plug penetrating the first and second interlayer insulation layers to electrically connect the gate of the isolation transistor to another one of the second peripheral interconnection patterns.

In various embodiments, the peripheral circuit may be a sub-word line driver.

In various embodiments, the semiconductor device may further include protection layers between the gates and the first interlayer insulation layer, bit lines between the protection layers and the first interlayer insulation layer, an insulation layer filling spaces between the bit lines and exposing upper sidewalls of the bit lines, and a capping layer between the bit lines and the first interlayer insulation layer.

According to various embodiments, a method of fabricating a semiconductor device includes providing a semiconductor substrate having a cell region and a peripheral region, forming a first conductive line and a second conductive line that extend onto the substrate of the peripheral region to constitute a peripheral circuit, forming a first interlayer insulation layer on the first and second conductive lines and the semiconductor substrate, forming a first contact plug and a first peripheral interconnection pattern that are electrically connected to the first conductive line, forming a second interlayer insulation layer on the first peripheral interconnection pattern and the first interlayer insulation layer, forming a second contact plug that penetrates the second interlayer insulation layer to be connected to the first peripheral interconnection pattern and a third contact plug that penetrates the first and second interlayer insulation layers to be connected to the second conductive line, and second peripheral interconnection patterns on respective ones of the second and third contact plugs.

In various embodiments, the first and second conductive lines may be formed to substantially have buried gate shapes. Forming the first interlayer insulation layer may be preceded by forming protection layers on respective ones of the first and second conductive lines, forming bit lines that cross over the protection layers and an insulation layer that fills spaces between the bit lines and exposes upper sidewalls of the bit lines, and forming a capping layer that covers the bit lines.

In various embodiments, the peripheral circuit may be a sub-word line driver.

In various embodiments, the peripheral circuit may be a sense amplifier.

In various embodiments, forming the first contact plug and the first peripheral interconnection pattern may include forming a mask pattern on the first interlayer insulation layer, etching the first interlayer insulation layer using the mask pattern as an etch mask to form a first contact hole exposing a portion of the first conductive line, sequentially forming a barrier metal layer and a metal layer on the first interlayer insulation layer to fill the first contact hole, forming a first hard mask layer on the metal layer, patterning the first hard mask layer to form a first hard mask pattern, and etching the metal layer and the barrier metal layer using the first hard mask pattern as an etch mask to form a first contact plug filling the first contact hole and a first peripheral interconnection pattern covering the first contact plug.

In various embodiments, the second contact plug may be formed such that one of the second peripheral interconnection patterns is electrically connected to the first conductive line through the second contact plug.

In various embodiments, the third contact plug may be formed such that another of the second peripheral interconnection patterns is electrically connected to the second conductive line through the third contact plug.

BRIEF DESCRIPTION OF THE DRAWINGS

Embodiments of the inventive concept will become more apparent in view of the attached drawings and accompanying detailed description.

DETAILED DESCRIPTION OF THE EMBODIMENTS

Various embodiments will now be described more fully hereinafter with reference to the accompanying drawings. It should be noted, however, that the inventive subject matter is not limited to the following embodiments, and may be implemented in various and different forms.

Various embodiments of the inventive concept may provide methods of maximizing the number of net dies formed in a wafer by increasing the number of patterns formed in a limited area with an optimized design rule. According to the various embodiments, a double-layered metal structure including two stacked metal layers (e.g., an upper metal layer and a lower metal layer) may be employed instead of a first metal layer formed in a peripheral circuit region. This is because there may be some limitations in patterning the first metal layer composed of a single metal layer even though a double patterning technology is used to pattern the first metal layer. The upper and lower metal layers may be electrically connected to each other through metal contact plugs, thereby constituting a peripheral circuit such as a sense amplifier (SA) or a sub-word line driver (SWD).

In the double-layered metal structure, a lower metal line may be referred to as a first metal line and an upper metal line may be referred to as a second metal line. Further, a metal contact plug connecting the first metal line to a word line may be referred to as a first metal contact plug and a metal contact plug connecting the first metal line to the second metal line may be referred to as a second metal contact plug.

Figure 1:
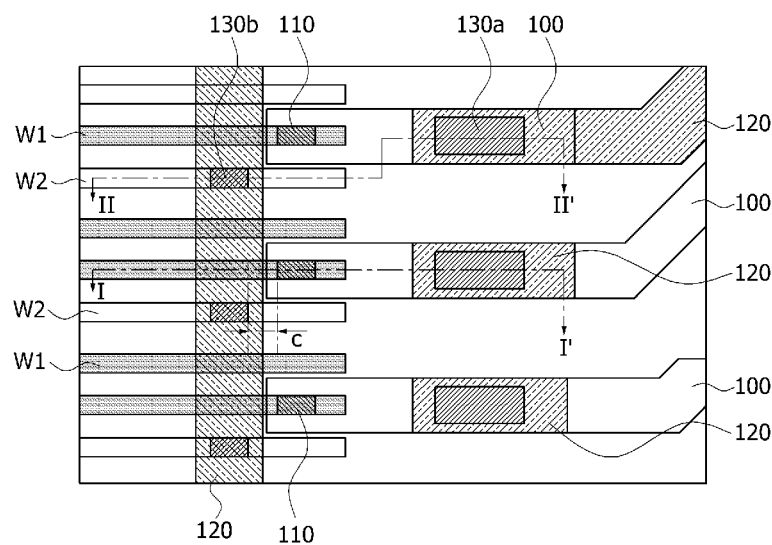
FIGS. 1, 2, and 3 are layout diagrams illustrating interconnection lines in a sub-word line driver of a semiconductor device according to various embodiments.
Figure 2:
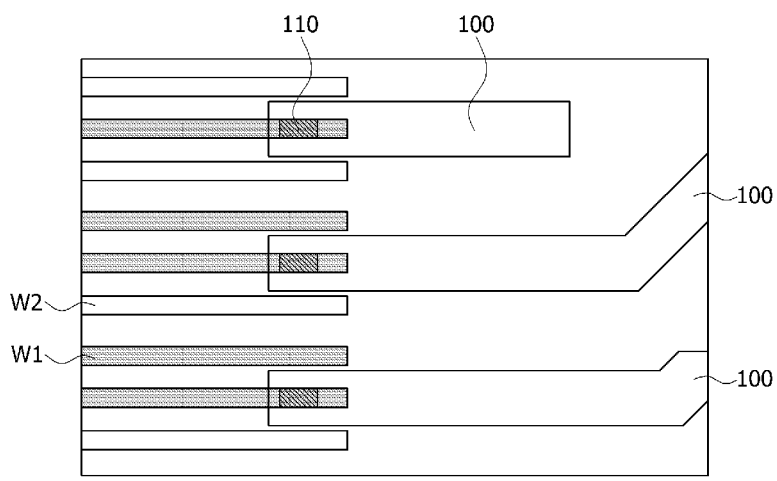
Figure 3:
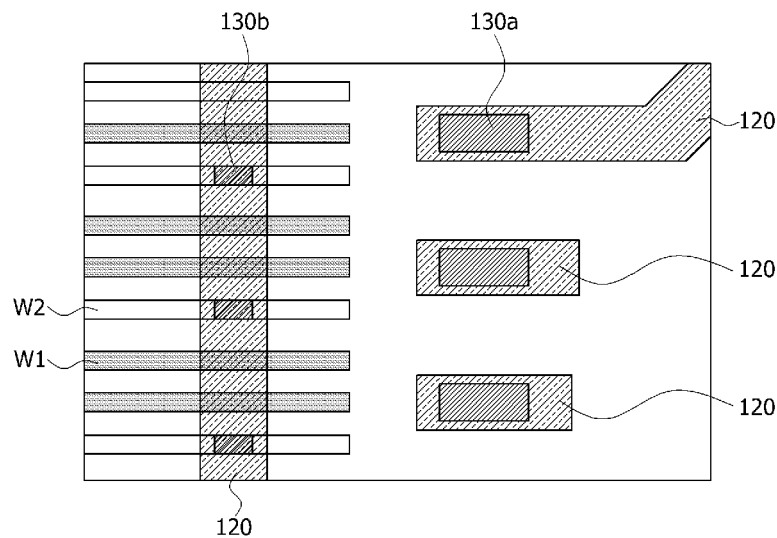

FIGS. 1, 2, and 3 are layout diagrams illustrating interconnection lines in a sub-word line driver of a semiconductor device according to various embodiments.

A semiconductor device according to an embodiment may include a cell array region in which a plurality of memory cells are disposed and a peripheral circuit region in which peripheral circuits are disposed. The peripheral circuits may control the operations of the memory cells and may include sense amplifiers (SA) for amplifying bit line voltages or bit line currents of the memory cells and sub-word line drivers (SWD) for generating word line signals. The memory cells may be located at cross points of bit lines and word lines. When the semiconductor devices correspond to DRAM devices, each of the memory cells may include a cell transistor acting as a switching element and a cell capacitor acting as a data storage element. A drain of the cell transistor may be electrically connected to one of the bit lines, and a source of the cell transistor may be electrically connected to a storage node of the cell capacitor. Further, a plate node of the cell capacitor may be electrically connected to a common plate electrode, and a gate of the cell transistor may be electrically connected to one of the word lines.

The sub-word line drivers (SWD) may be configured to include peripheral transistors formed in the peripheral circuit region and peripheral circuit interconnection lines for connecting the peripheral transistors to each other. These peripheral circuit interconnection lines may be disposed on a semiconductor substrate, as illustrated in FIG. 1. The peripheral circuit interconnection lines may be electrically connected to active regions (e.g., source/drain regions) of the peripheral transistors, gates of the peripheral transistors, word lines extended from the cell array region, and bit lines extended from the cell array region through metal contact plugs. In the event that a height of the cell capacitors (e.g., the storage nodes of the cell capacitors) is increased to obtain a large cell capacitance, heights of the metal contact plugs may also be increased in proportion of the height of the storage nodes. That is, depths of metal contact holes, in which the metal contact plugs are formed, may increase. In such a case, it may be difficult to form the metal contact holes using a typical etching process. Thus, it may require that the metal contact plugs are formed to include lower metal contact plugs and upper metal contact plugs located at higher level than the lower metal contact plugs.

Referring to FIGS. 1, 2, and 3, a peripheral interconnection layout illustrated in FIG. 1 is a composite layout including a first peripheral interconnection layout of FIG. 2 and a second peripheral interconnection layout of FIG. 3. That is, the first peripheral interconnection layout including first peripheral interconnection patterns 100 of FIG. 2 and the second peripheral interconnection layout including second peripheral interconnection patterns 120 of FIG. 3 may be extracted from the composite peripheral interconnection layout illustrated in FIG. 1. The composite peripheral interconnection layout of FIG. 1 may be a peripheral interconnection layout of a sub-word line driver SWD. In such a case, the first peripheral interconnection patterns 100 of FIG. 2 may correspond to lower patterns disposed at a lower level than the second peripheral interconnection patterns 120 of FIG. 3, and the second peripheral interconnection patterns 120 of FIG. 3 may correspond to upper patterns disposed at a higher level than the first peripheral interconnection patterns 100 of FIG. 2. The composite layout of FIG. 1 may further include a layout of second contact plugs 130a that electrically connect the first peripheral interconnection patterns 100 to some of the second peripheral interconnection patterns 120. Moreover, the first peripheral interconnection patterns 100 may be electrically connected to first word lines W1 extending from gate electrodes of cell transistors through first contact plugs 110, and the rest of the second peripheral interconnection patterns 120 may be electrically connected to second word lines W2 extending from gate electrodes of isolation transistors through third contact plugs 130b.

As described above, the peripheral interconnections may be configured to have a double-layered structure including the first peripheral interconnection patterns 100 (e.g., lower patterns) and the second peripheral interconnection patterns 120 (e.g., upper patterns). As a result, pitch sizes of the first and second peripheral interconnection patterns 100 and 120 may be increased in a limited planar area. In addition, the first word lines W1 may be electrically connected to the first peripheral interconnection patterns 100 through the first contact plugs 110 and the second word lines W2 may be electrically connected to at least one among the second peripheral interconnection patterns 120 through the third contact plugs 130b, as described above. Thus, spaces C between the first contact plugs 110 and the third contact plugs 130b may be minimized to reduce an area that the sub-word line driver (SWD) occupies. The reduction of the area of the sub-word line driver (SWD) may lead to increase the number of net dies formed on a wafer.

Figure 5:
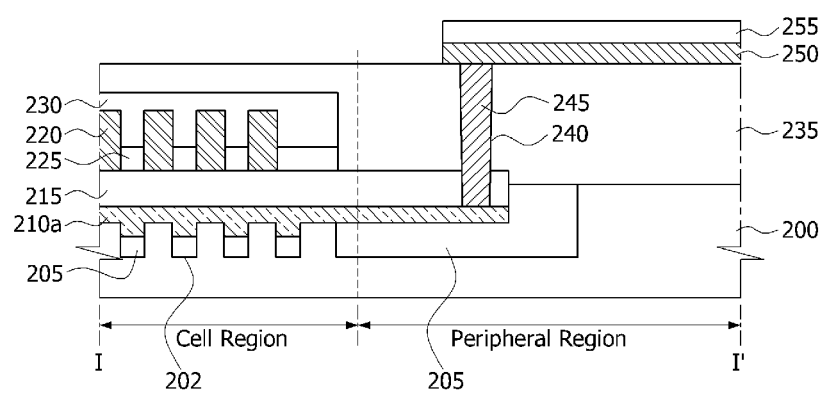
Figure 6:
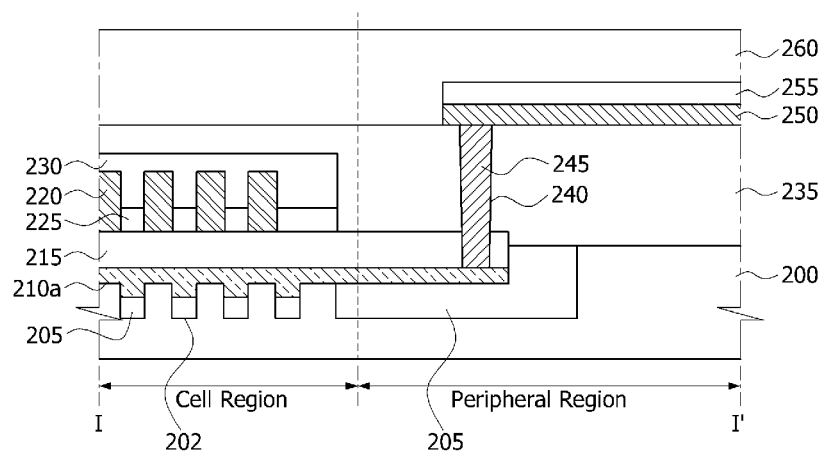
Figure 7A:
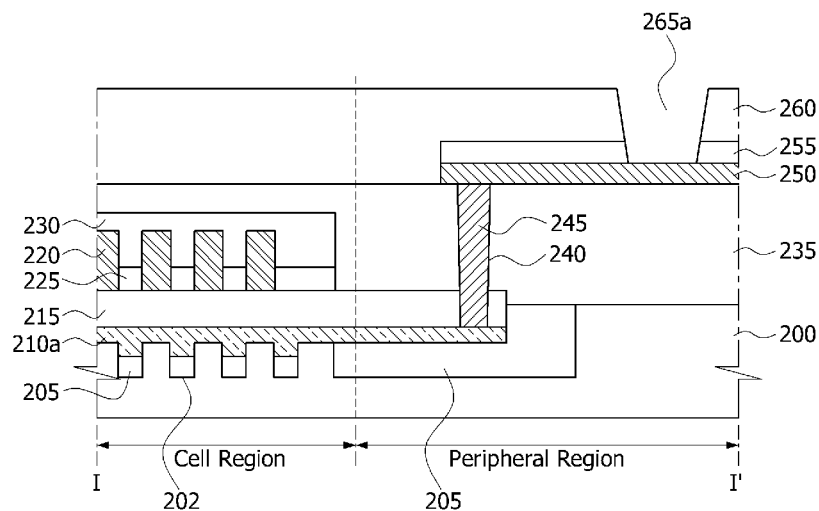
Figure 7B:
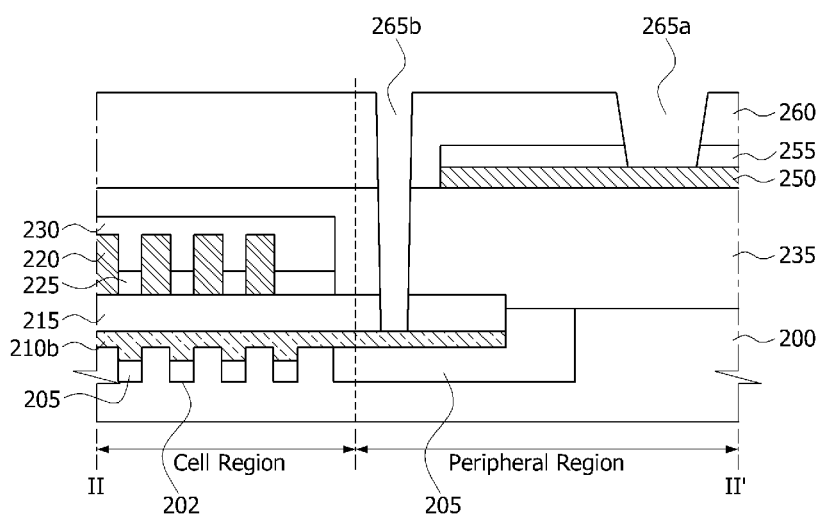
Figure 8A:
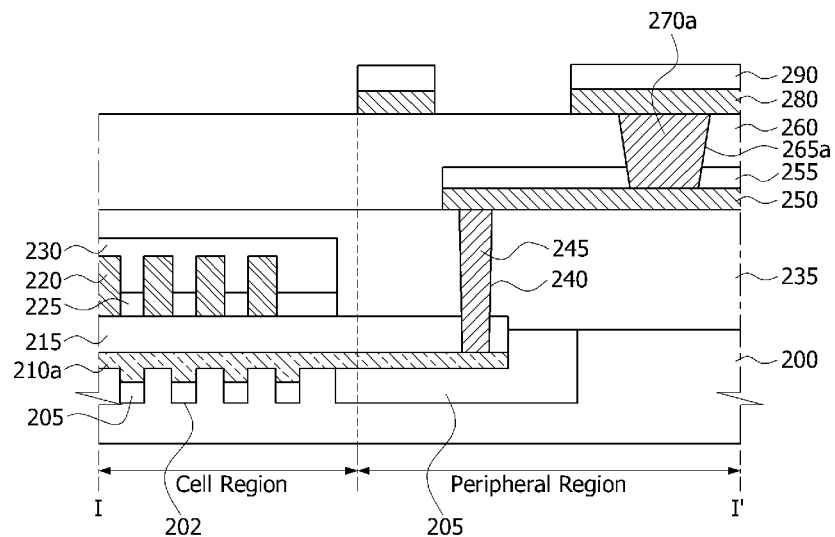
Figure 8B:
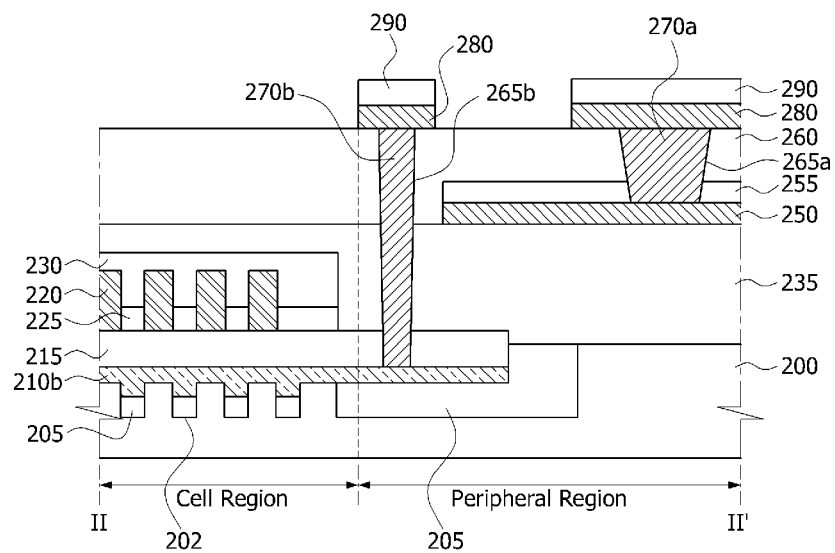

FIGS. 4, 5, 6, 7A, 7B, 8A, and 8B are cross sectional views illustrating a method of fabricating a semiconductor device according to various embodiments. FIGS. 4, 5, 6, 7A, and 8A are vertical cross sectional views taken along a line I-I' of FIG. 1, and FIGS. 7B and 8B are vertical cross sectional views taken along a line II-II' of FIG. 1. Thus, the same reference numerals or the same reference designators may denote the same elements throughout the specification.

Figure 4:
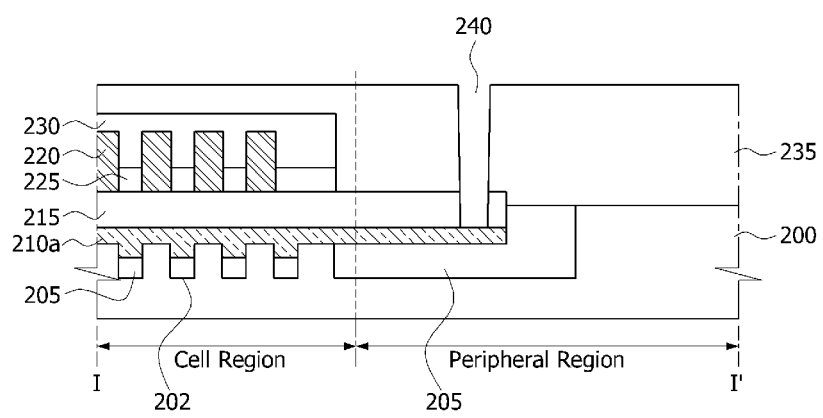
FIGS. 4, 5, 6, 7A, 7B, 8A, and 8B are cross sectional views illustrating a method of fabricating a semiconductor device according to various embodiments.

Referring to FIG. 4, an isolation layer 205 defining active regions may be formed in a semiconductor substrate 200. In an embodiment, the isolation layer 205 may be formed using a shallow trench isolation (STI) process. That is, the isolation layer 205 may be formed by etching the semiconductor substrate 200 to form an isolation trench 202 and by filling the isolation trench 202 with an insulation layer such as a silicon oxide layer. Cell transistors and isolation transistors may be formed in a cell region of the semiconductor substrate 200, and peripheral transistors and peripheral interconnections may be formed in a peripheral region of the semiconductor substrate 200. The peripheral region may surround the cell region. The cell transistors and the isolation transistors may constitute memory cells, and the peripheral transistors and the peripheral interconnections may constitute peripheral circuits such as sub-word line drivers (SWDs) and/or sense amplifiers (SAs). The peripheral region may include a peripheral circuit region and a core region.

The cell transistors may be formed to include buried gates 210a. This is for increasing channel lengths of the cell transistors in a limited planar area. The buried gates 210a may be fabricated by etching the semiconductor substrate 200 to form gate trenches that cross the active regions in the cell region and by forming cell gates in the gate trenches. During formation of the cell gates, peripheral gates (not shown) of the peripheral transistors may be formed in the peripheral region. Protection patterns 215 (i.e., protection layers 215) may be formed on respective ones of the buried gates 210a and the peripheral gates. The protection patterns 215 (i.e., protection layers 215) may be formed of an insulation layer, for example, a silicon nitride layer. The gates 210a of the cell transistors may extend into the peripheral region to act as first word lines (W1 of FIG. 1). Gate (210b of FIGS. 7B and 8B) of the isolation transistors may also be formed in the cell region. The protection patterns 215 (i.e., protection layers 215) may also be formed on the gates 210b of the isolation transistors. The gates 210b of the isolation transistors may extend into the peripheral region to act as second word lines (W2 of FIG. 1). Generally, a first conductive line may include the gate (210a) of the cell transistor and a second conductive line may include the gate (210b) of the isolation transistor.

Bit lines 220 may be then formed in the cell region. The bit lines 220 may be formed to intersect the buried gates 210a in a plan view. The bit lines 220 may be formed using a damascene process. Specifically, an insulation layer 225 may be formed on the substrate including the protection patterns 215 (i.e., protection layers 215). The insulation layer 225 may be formed to have a thickness which is equal to or greater than that of bit lines to be formed in a subsequent process. The insulation layer 225 may be patterned to form damascene trenches exposing portions of the protection patterns 215 (i.e., protection layers 215). Subsequently, a barrier metal layer and a metal layer may be sequentially formed in the damascene trenches, thereby forming the bit lines 220 in respective ones of the damascene trenches. The metal layer constituting the bit lines 220 may be formed of a tungsten (W) layer.

After formation of the bit lines 220, the insulation layer 225 may be recessed by a predetermined thickness to expose upper sidewalls of the bit lines 220. A capping layer 230 may then be formed to cover the bit lines 220. The capping layer 230 may be formed to fill the recessed region between the bit lines 220. The capping layer 230 may be formed of an insulation layer, for example, a silicon nitride layer. The capping layer 230 may be formed in the cell region.

Referring again to FIG. 4, a first interlayer insulation layer 235 may be formed on the substrate including the capping layer 230. The first interlayer insulation layer 235 and the protection layer 215 (i.e., protection pattern 215) may be patterned to form first contact holes 240 exposing portions of the buried gates 210a extending into the peripheral region. Forming the first contact holes 240 may include forming a mask pattern (not shown) having openings that correspond to the first contact plugs (110 of FIG. 1 or 2) on the first interlayer insulation layer 235 and etching the first interlayer insulation layer 235 and the protection layer 215 using the mask patterns as etching masks. Consequently, the first contact holes 240 may be formed to be aligned with the buried gates 210a of the cell transistors.

Referring to FIG. 5, a first peripheral interconnection layer may be formed in the first contact holes 240 and on the first interlayer insulation layer 235. The first peripheral interconnection layer may be formed by conforming and depositing a barrier metal layer in the first contact holes 240 and on the first interlayer insulation layer 235 and by depositing a metal layer on the barrier metal layer to fill the first contact holes 240. The barrier metal layer may be formed to include a titanium (Ti) layer and a titanium nitride (TiN) layer, and the metal layer may be formed of a tungsten (W) layer. A first hard mask layer may then be formed on the first peripheral interconnection layer. The first hard mask layer may be formed to more readily and accurately etch the first peripheral interconnection layer in a subsequent process. The first hard mask layer may be formed of an insulation layer, for example, a silicon nitride (SiN) layer.

Subsequently, the first hard mask layer may be patterned to form first hard mask patterns 255 covering the first contact holes 240, and the first peripheral interconnection layer may be etched using the first hard mask pattern 255 as an etch mask to form first peripheral interconnection patterns 250. After formation of the first peripheral interconnection patterns 250, first peripheral interconnection patterns 250 remaining in the first contact holes 240 may correspond to first contact plugs 245.

Referring to FIG. 6, a second interlayer insulation layer 260 may be formed on the first interlayer insulation layer 235, the first peripheral interconnection patterns 250 and the first hard mask pattern 255. The second interlayer insulation layer 260 may be formed by depositing an insulation layer such as a silicon oxide (SiO) layer and by planarizing the insulation layer using a chemical mechanical polishing (CMP) process.

Referring to FIGS. 7A and 7B, the second interlayer insulation layer 260, the first hard mask patterns 255, the first interlayer insulation layer 235 and the protection layers 215 may be patterned to form second contact holes 265a exposing portions of the first peripheral interconnection patterns 250 and third contact holes 265b exposing portions of the gates 210b of the isolation transistors.

Forming the second contact holes 265a may include forming a mask pattern (not shown) having openings that correspond to the second and third contact plugs (130a and 130b of FIG. 1 or 3) on the second interlayer insulation layer 260 and etching the second interlayer insulation layer 260, the first hard mask patterns 255, the first interlayer insulation layer 235 and the protection layers 215 using the mask pattern as an etching mask. The second contact holes 265a may be formed to be substantially aligned with the first peripheral interconnection patterns 250, and the third contact holes 265b may be formed to be substantially aligned with the gates 210b of the isolation transistors.

Referring to FIGS. 8A and 8B, a second peripheral interconnection layer may be formed in the second and third contact holes 265a and 265b and on the second interlayer insulation layer 260. The second peripheral interconnection layer may be formed by conformally depositing a barrier metal layer in the second and third contact holes 265a and 265b and on the second interlayer insulation layer 260 and by depositing a metal layer on the barrier metal layer to fill the second and third contact holes 265a and 265b. The barrier metal layer may be formed to include a titanium (Ti) layer and a titanium nitride (TiN) layer, and the metal layer may be formed of a tungsten (W) layer. A second hard mask layer may then be formed on the second peripheral interconnection layer. The second hard mask layer may be formed to more readily and accurately etch the second peripheral interconnection layer in a subsequent process. The second hard mask layer may be formed of an insulation layer, for example, a silicon nitride (SiN) layer.

Subsequently, the second hard mask layer may be patterned to form second hard mask patterns 290 covering the second and third contact holes 265a and 265b, and the second peripheral interconnection layer may be etched using the second hard mask patterns 290 as etch masks to form second peripheral interconnection patterns 280. After formation of the second peripheral interconnection patterns 280, second peripheral interconnection patterns remaining in the second contact holes 265a may correspond to second contact plugs 270a and second peripheral interconnection patterns remaining in the third contact holes 265b may correspond to third contact plugs 270b.

The third contact plugs 270b may directly connect the gates 210b of the isolation transistors to some of the second peripheral interconnection patterns 280. Accordingly, if bias voltages are applied to some of the second peripheral interconnection patterns 280, the isolation transistors may operate. Further, the second contact plugs 270a may electrically connect the first peripheral interconnection patterns 250 to the rest of the second peripheral interconnection patterns 280. Thus, if bias voltages are applied to the rest of the second peripheral interconnection patterns 280, the cell transistors may operate.

As described above, the gates 210a of the cell transistors may be electrically connected to some of the second peripheral interconnection patterns 280 through the first contact plugs 245 and the second contact plugs 270a which are formed at two different levels. Thus, design rules of the peripheral interconnection patterns 250 and 280 and the contact holes 240, 265a, and 265b may be improved even without increase of a planar area of the peripheral region. That is, process margins may be increased when the peripheral interconnection patterns 250 and 280 and the contact holes 240, 265a, and 265b are formed.

Although the embodiments are described in conjunction with the sub-word line driver (SWD) of a semiconductor device, the embodiments are equally applicable to any peripheral circuits of the semiconductor device, for example, a sense amplifier of the semiconductor device, etc.

Figure 9:
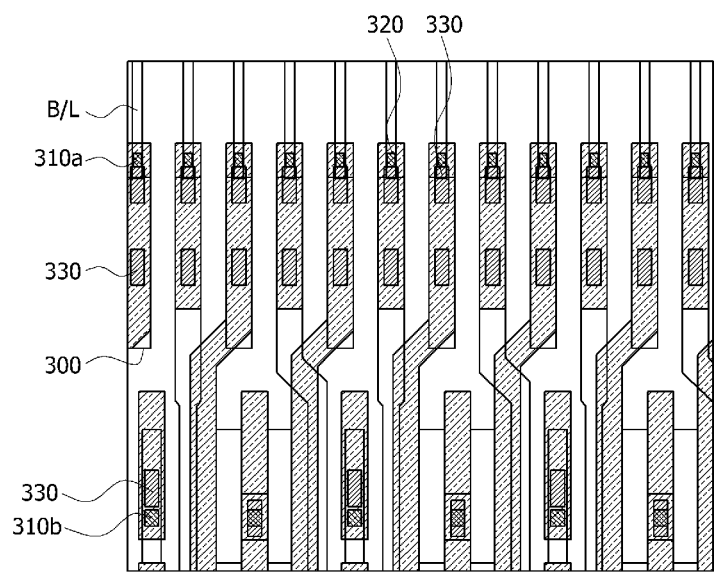
FIGS. 9, 10, and 11 are layout diagrams illustrating interconnection lines used in sense amplifiers of a semiconductor device according to various embodiments.
Figure 10:
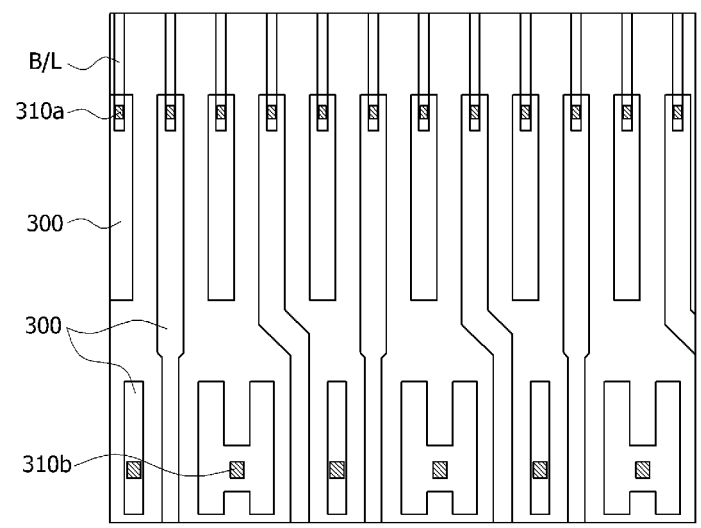
Figure 11:
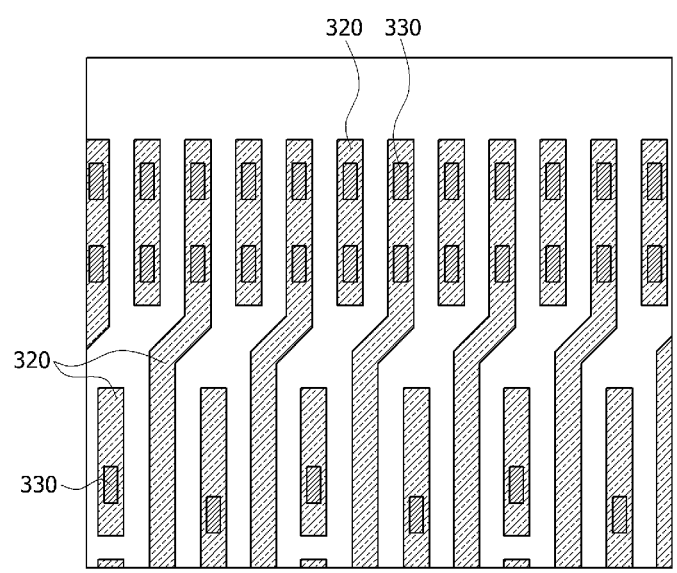

FIGS. 9, 10, and 11 are layout diagrams illustrating interconnection lines used in sense amplifiers of a semiconductor device according to an embodiment.

Each of the memory cells in a semiconductor device, for example, a DRAM device may include a cell transistor disposed at a cross point of a word line and a bit line and a cell capacitor having a storage node electrically connected to a source of the cell transistor. Data stored in the cell capacitors may be read out by sense amplifiers. Each of the sense amplifiers may be configured to include peripheral interconnection lines electrically connected to peripheral transistors formed in a peripheral region. The peripheral interconnection lines of the sense amplifiers may be disposed, as illustrated in FIG. 9.

Referring to FIGS. 9, 10, and 11, a peripheral interconnection layout illustrated in FIG. 9 is a composite layout including a first peripheral interconnection layout of FIG. 10 and a second peripheral interconnection layout of FIG. 11. That is, the first peripheral interconnection layout including first peripheral interconnection patterns 300 of FIG. 10 and the second peripheral interconnection layout including second peripheral interconnection patterns 320 of FIG. 11 may be extracted from the composite peripheral interconnection layout illustrated in FIG. 9. The composite peripheral interconnection layout of FIG. 9 may be a peripheral interconnection layout of a sense amplifier SA disposed in a peripheral region of the semiconductor device. In such a case, the first peripheral interconnection patterns 300 of FIG. 10 may correspond to lower patterns disposed at a lower level than the second peripheral interconnection patterns 320 of FIG. 11, and the second peripheral interconnection patterns 320 of FIG. 11 may correspond to upper patterns disposed at a higher level than the first peripheral interconnection patterns 300 of FIG. 10. The composite layout of FIG. 9 may further include a layout of first contact plugs 310a, second contact plugs 310b and third contact plugs 330.

The first contact plugs 310a may be disposed to electrically connect bit lines B/L extending from a cell region to some of the first peripheral interconnection patterns 300. Some of the second contact plugs 310b may be disposed to electrically connect gates (not shown) of peripheral transistors to others of the first peripheral interconnection patterns 300, and the others of the second contact plugs 310b may be disposed to electrically connect active regions to the rest of the first peripheral interconnection patterns 300. Further, the third contact plugs 330 may be disposed to electrically connect the first peripheral interconnection patterns 300 to the second peripheral interconnection patterns 320. The bit lines B/L may be electrically connected to the first peripheral interconnection patterns 300 through only the first contact plugs 310a.

According to the embodiments set forth above, electrical connections between peripheral interconnection patterns and gates (or active regions) may be achieved using lower contact plugs (e.g., first and second contact plugs) and upper contact plugs (e.g., third contact plugs) formed at two different levels. Thus, a process margin of contact holes, in which the contact plugs are formed, may be improved. Further, the peripheral interconnection patterns may include first peripheral interconnection patterns connected to the lower contact plugs and second peripheral interconnection patterns connected to the upper contact plugs, and the first and second peripheral interconnection patterns may be disposed at two different levels. Accordingly, pitch sizes of the first and second peripheral interconnection patterns may be minimized to increase the integration density of the semiconductor device.

The various embodiments have been disclosed above for illustrative purposes. Those skilled in the art will appreciate that various modifications, additions, and substitutions are possible, without departing from the scope and spirit of the inventive concept as disclosed in the accompanying claims.

What is claimed is:

1. A semiconductor device comprising:
  a semiconductor substrate having a cell region and a peripheral region;
  a first conductive line and a second conductive line extending onto the semiconductor substrate of the peripheral region to constitute a peripheral circuit;
  a first interlayer insulation layer on the first and second conductive lines and on the semiconductor substrate;
  a first peripheral interconnection pattern on the first interlayer insulation layer of the peripheral region;
  a first contact plug disposed in the first interlayer insulation layer of the peripheral region to electrically connect the first conductive line to the first peripheral interconnection pattern;
  a second interlayer insulation layer on the first interlayer insulation layer and on the first peripheral interconnection pattern;
  second peripheral interconnection patterns on the second interlayer insulation layer of the peripheral region;
  a second contact plug disposed in the second interlayer insulation layer to electrically connect the first peripheral interconnection pattern to one of the second peripheral interconnection patterns; and
  a third contact plug penetrating the first and second interlayer insulation layers to electrically connect the second conductive line to another one of the second peripheral interconnection patterns.

2. The semiconductor device of claim 1, wherein the peripheral circuit is a sub-word line driver.

3. The semiconductor device of claim 1, wherein the first conductive line includes a gate of a cell transistor, and the second conductive line includes a gate of an isolation transistor.

4. The semiconductor device of claim 1, wherein the peripheral circuit is a sense amplifier, and the first and second conductive lines are electrically connected to bit lines formed in the cell region.

5. The semiconductor device of claim 1, further comprising:
  protection layers between the first and second conductive lines and the first interlayer insulation layer;
  bit lines between the protection layers and the first interlayer insulation layer;
  an insulation layer filling spaces between the bit lines and exposing upper sidewalls of the bit lines; and
  a capping layer between the bit lines and the first interlayer insulation layer.

6. The semiconductor device of claim 5, wherein the protection layers are formed of silicon nitride layers.

7. The semiconductor device of claim 1, wherein the peripheral region surrounds the cell region.

8. The semiconductor device of claim 1, wherein the peripheral region includes a peripheral circuit region and a core region.

9. A semiconductor device comprising:
  a semiconductor substrate having a cell region and a peripheral region;

a gate of a cell transistor and a gate of an isolation transistor extending onto the semiconductor substrate from the cell region to the peripheral region to constitute a peripheral circuit;

a first interlayer insulation layer on the gate of the cell transistor, the gate of the isolation transistor and the semiconductor substrate;

a first peripheral interconnection pattern on the first interlayer insulation layer of the peripheral region;

a first contact plug disposed in the first interlayer insulation layer of the peripheral region to electrically connect the gate of the cell transistor to the first peripheral interconnection pattern;

a second interlayer insulation layer on the first interlayer insulation layer and on the first peripheral interconnection pattern;

second peripheral interconnection patterns on the second interlayer insulation layer of the peripheral region;

a second contact plug disposed in the second interlayer insulation layer to electrically connect the first peripheral interconnection pattern to one of the second peripheral interconnection patterns; and a third contact plug penetrating the first and second interlayer insulation layers to electrically connect the gate of the isolation transistor to another one of the second peripheral interconnection patterns.

10. The semiconductor device of claim 9, wherein the peripheral circuit is a sub-word line driver.

11. The semiconductor device of claim 9, further comprising:

protection layers between the gates and the first interlayer insulation layer;

bit lines between the protection layers and the first interlayer insulation layer;

an insulation layer filling spaces between the bit lines and exposing upper sidewalls of the bit lines; and a capping layer between the bit lines and the first interlayer insulation layer.

12. The semiconductor device of claim 11, wherein the bit lines are formed using a damascene process.

13. A method of fabricating a semiconductor device, the method comprising:

providing a semiconductor substrate having a cell region and a peripheral region;

forming a first conductive line and a second conductive line that extend onto the substrate of the peripheral region to constitute a peripheral circuit;

forming a first interlayer insulation layer on the first and second conductive lines and the semiconductor substrate;

forming a first contact plug and a first peripheral interconnection pattern that are electrically connected to the first conductive line;

forming a second interlayer insulation layer on the first peripheral interconnection pattern and the first interlayer insulation layer;

forming a second contact plug that penetrates the second interlayer insulation layer to be connected to the first peripheral interconnection pattern and a third contact plug that penetrates the first and second interlayer insulation layers to be connected to the second conductive line; and second peripheral interconnection patterns on respective ones of the second and third contact plugs.

14. The method of claim 13, wherein the first and second conductive lines are formed to have buried gate shapes, and wherein forming the first interlayer insulation layer is preceded by:

forming protection layers on respective ones of the first and second conductive lines;

forming bit lines that cross over the protection layers and an insulation layer that fills spaces between the bit lines and exposes upper sidewalls of the bit lines; and forming a capping layer that covers the bit lines.

15. The method of claim 13, wherein the peripheral circuit is a sub-word line driver.

16. The method of claim 13, wherein the peripheral circuit is a sense amplifier.

17. The method of claim 13, wherein forming the first contact plug and the first peripheral interconnection pattern includes:

forming a mask pattern on the first interlayer insulation layer;

etching the first interlayer insulation layer using the mask pattern as an etch mask to form a first contact hole exposing a portion of the first conductive line;

sequentially forming a barrier metal layer and a metal layer on the first interlayer insulation layer to fill the first contact hole;

forming a first hard mask layer on the metal layer;

patterning the first hard mask layer to form a first hard mask pattern; and etching the metal layer and the barrier metal layer using the first hard mask pattern as an etch mask to form a first contact plug filling the first contact hole and a first peripheral interconnection pattern covering the first contact plug.

18. The method of claim 13, wherein the second contact plug is formed such that one of the second peripheral interconnection patterns is electrically connected to the first conductive line through the second contact plug.

19. The method of claim 13, wherein the third contact plug is formed such that another of the second peripheral interconnection patterns is electrically connected to the second conductive line through the third contact plug.

* * * * *